United States Patent
Kim et al.

(10) Patent No.: US 8,686,427 B2
(45) Date of Patent: Apr. 1, 2014

(54) LIQUID CRYSTAL DISPLAY AND METHOD OF MANUFACTURING THE SAME

(75) Inventors: Chang Ok Kim, Seoul (KR); Hyeongsuk Yoo, Yongin-si (KR); Jieun Nam, Seoul (KR); Kiseong Seo, Seoul (KR); Jae Sul An, Hwaseong-si (KR); Taeyoung Ahn, Seoul (KR); Jungyun Jo, Namyangju-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/600,750

(22) Filed: Aug. 31, 2012

(65) Prior Publication Data
US 2013/0264571 A1 Oct. 10, 2013

(30) Foreign Application Priority Data
Apr. 10, 2012 (KR) ........................ 10-2012-0037507

(51) Int. Cl.
*H01L 29/786* (2006.01)
*H01L 33/08* (2010.01)
*G02F 1/1343* (2006.01)

(52) U.S. Cl.
USPC .. 257/72; 257/59; 257/E29.273; 257/E33.06; 257/E51.002; 438/34

(58) Field of Classification Search
None
See application file for complete search history.

(56) References Cited

U.S. PATENT DOCUMENTS

| 2004/0201808 A1* | 10/2004 | Chen et al. | 349/138 |
| 2008/0225217 A1* | 9/2008 | Wakabayashi | 349/144 |

FOREIGN PATENT DOCUMENTS

| JP | 2007-047797 | | 2/2007 | |
| JP | 2009-053658 | | 3/2009 | |
| KR | 1020070003501 A | | 1/2007 | |
| KR | 1020080056811 A | | 6/2008 | |
| KR | 1020090047346 A | | 5/2009 | |
| KR | 1020100066233 A | | 6/2010 | |
| KR | 1020100122404 A | | 11/2010 | |
| KR | 1020110018246 A | | 2/2011 | |
| KR | 1020110038572 A | | 4/2011 | |
| KR | 1020110050038 A | | 5/2011 | |
| KR | 1020110052228 A | | 5/2011 | |
| KR | 2011071313 | * | 6/2011 | ............ G02F 1/136 |
| KR | 1020110071313 A | | 6/2011 | |

OTHER PUBLICATIONS

Hong, W.S., et. al. "Fabrication of Novel TFT LCD Panels with High Aperature Ratio Using a-SiCO:H Films as a Passivation Layer", Mat. Res. Soc. Symp. Proc. vol. 762, (2003), pp. A21.3.1-A21.3.6.*

(Continued)

*Primary Examiner* — Thomas L Dickey
*Assistant Examiner* — Joseph Schoenholtz
(74) *Attorney, Agent, or Firm* — F. Chau & Associates, LLC

(57) ABSTRACT

A display apparatus includes a first substrate including pixels, a second substrate facing the first substrate, and a liquid crystal layer interposed between the first substrate and the second substrate. Each of the pixels includes a thin film transistor disposed on a first insulating substrate, a first protective layer that covers the thin film transistor and includes a SiOC layer, a first electrode disposed on the first protective layer, a second protective layer that covers the first electrode, and a second electrode disposed on the second protective layer.

21 Claims, 16 Drawing Sheets

(56) References Cited

OTHER PUBLICATIONS

Chiang, Chiu-Chih, Mao-Chieh Chen, Lain-Jong Li, Zhen-Cheng Wu, Syun-Ming Jang, and Mong-Song Liang. "Physical and Barrier Properties of Amorphous Silicon-Oxycarbide Deposited by PECVD from Octamethylcyclotetrasiloxane." Journal of the Electrochemical Society 151.9 (2004): G612.*

Predicting Capacitance Coupling of IPS Mode TFT-LCD using CLEVER', SIMUCAD Application Note 3-001, downloaded from URL< http://www.silvaco.com/content/appNotes/interconnect/3-001_IPS_TFTLCD_CLEV.pdf> on Aug. 8, 2013.*

Machine Translation of KR 2011071313.*

* cited by examiner

LIQUID CRYSTAL DISPLAY AND METHOD OF MANUFACTURING THE SAME

CROSS-REFERENCE TO RELATED APPLICATION

This application claims priority to Korean Patent Application No. 10-2012-0037507, filed on Apr. 10, 2012, the entire contents of which are herein incorporated by reference.

TECHNICAL FIELD

The disclosure relates to a liquid crystal display and a method of manufacturing the same. More particularly, the disclosure relates to a PLS (plane-to-switching) mode liquid crystal display and a method of manufacturing the PLS mode liquid crystal display.

DISCUSSION OF THE RELATED ART

Liquid crystal displays are flat display apparatuses that display images using a liquid crystal layer. Liquid crystal displays may be classified into in-plane-switching (IPS) mode liquid crystal displays, vertical alignment (VA) mode liquid crystal displays, and plane-to-switching (PLS) mode liquid crystal displays according to a method of driving the liquid crystal layer.

The PLS mode liquid crystal displays drive the liquid crystal layer and display images using a horizontal electric field and a vertical electric field. In the PLS mode driving scheme, a fringe electric field results in rotation of liquid crystal molecules of the liquid crystal layer over an electrode in a direction which is substantially in parallel with a substrate.

SUMMARY

The present disclosure provides a liquid crystal display that can remove afterimages and reduce signal interference and a method of manufacturing the liquid crystal display.

An embodiment of the inventive concept provides a liquid crystal display includes a first substrate that includes a plurality of pixels, a second substrate facing the first substrate, and a liquid crystal layer interposed between the first substrate and the second substrate.

At least one of the pixels includes a thin film transistor disposed on a first insulating substrate, a first protective layer that covers the thin film transistor and includes a SiOC layer, a first electrode disposed on the first protective layer, a second protective layer that covers the first electrode, and a second electrode disposed on the second protective layer.

An embodiment of the inventive concept provides a method of manufacturing a liquid crystal display including a first substrate including a plurality of pixels, a second substrate facing the first substrate, and a liquid crystal display interposed between the first and second substrates is provided as follows. A thin film transistor is formed on a first insulating substrate, and a first protective layer including a SiOC layer is formed to cover the thin film transistor. When a first electrode is formed on the first protective layer, a second protective layer is formed to cover the first electrode and a second electrode is formed on the second protective layer.

According to an embodiment of the present invention, there is provided a display apparatus including a plurality of data lines, an SiOC layer on the plurality of data lines, a common electrode on the SiOC layer, a protective layer on the common electrode, and a pixel electrode on the protective layer. The display apparatus may further include a capping layer between the SiOC layer and the common electrode. The display apparatus may further include a buffer layer between the plurality of data lines and the SiOC layer. The SiOC layer may have a thickness of about two micrometers to about three micrometers.

According to the embodiments of the present invention, since the first protective layer includes the SiOC layer having a thickness equal to or larger than two micrometers, the common electrode and signal lines disposed under the common electrode may be sufficiently spaced apart from each other, thereby preventing signal interference from occurring.

In addition, the SiOC layer has superior heat resistance when compared with an organic layer, and thus the SiOC layer may be formed through a high temperature process. Thus, a deterioration of display quality, which is caused by the afterimage, may be prevented.

BRIEF DESCRIPTION OF THE DRAWINGS

The embodiments of the present invention will become readily apparent by reference to the following detailed description when considered in conjunction with the accompanying drawings wherein.

DETAILED DESCRIPTION

It will be understood that when an element or layer is referred to as being "on", "connected to" or "coupled to" another element or layer, it can be directly on, connected or coupled to the other element or layer or intervening elements or layers may be present. Like numbers may refer to like or similar elements throughout the specification and the drawings. The present invention may be embodied in various different ways and should not be construed as limited to the exemplary embodiments described herein. As used herein, the singular forms, "a", "an" and "the" are intended to include the plural forms as well, unless the context clearly indicates otherwise.

As will be appreciated by one skilled in the art, embodiments of the present invention may be embodied as a system, method, computer program product, or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain, or store a program for use by or in connection with an instruction execution system, apparatus, or device.

Hereinafter, the embodiments of the present invention will be described in detail with reference to the accompanying drawings.

Figure 1:
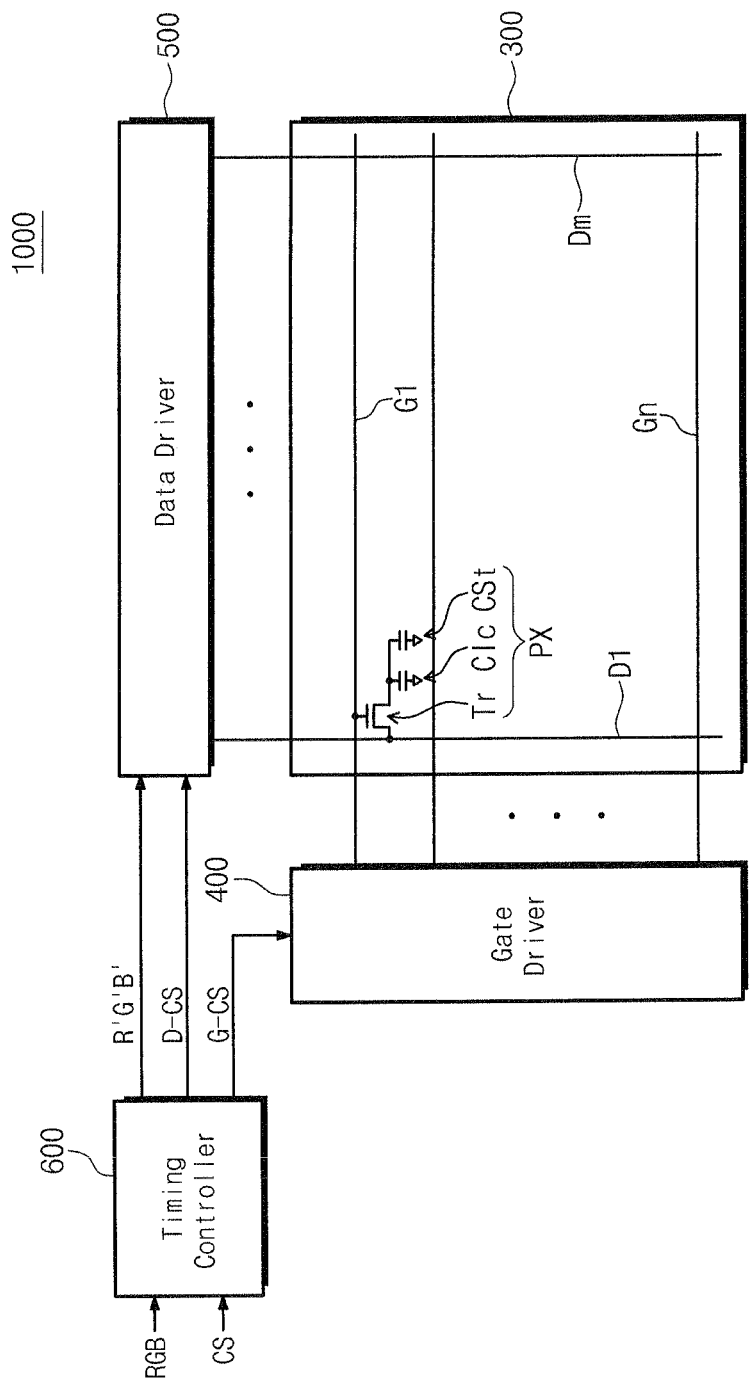
FIG. 1 is a block diagram showing a PLS mode liquid crystal display according to an exemplary embodiment of the invention.
Figure 2:
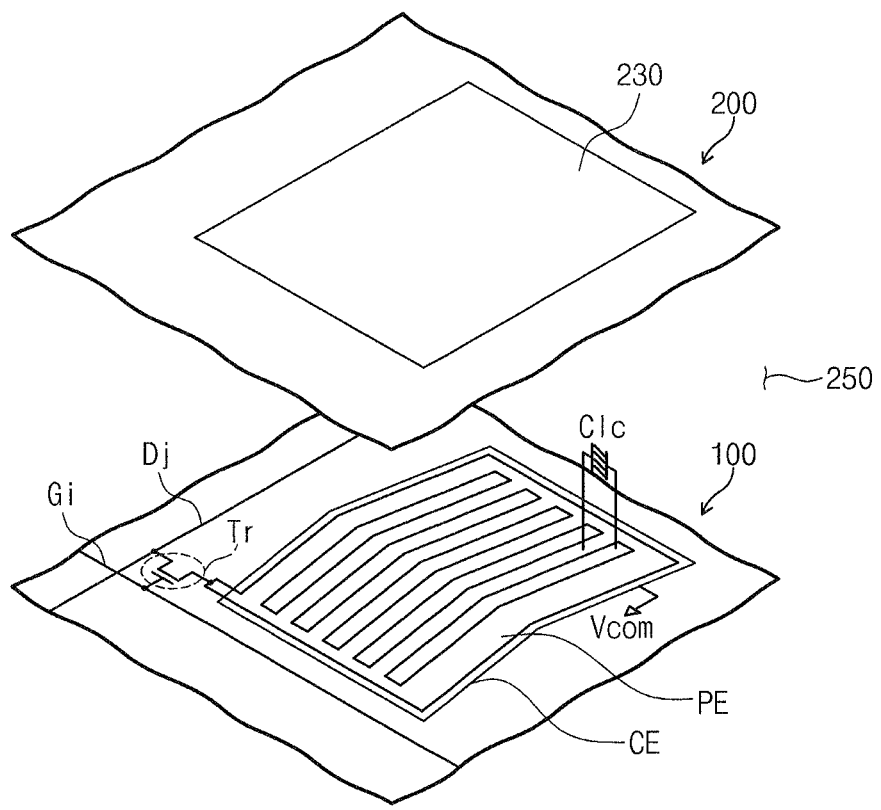
FIG. 2 is a view showing a pixel as shown in FIG. 1.

FIG. 1 is a block diagram showing a PLS mode liquid crystal display according to an exemplary embodiment of the invention, and FIG. 2 is a view showing a pixel shown in FIG. 1.

Referring to FIG. 1, a liquid crystal display 1000 includes an image display part 300 that displays an image, gate and data drivers 400 and 500 that drive the image display part 300, and a timing controller 600 that controls a drive of the gate driver 400 and the data driver 500.

The image display part 300 includes a plurality of gate lines G1 to Gn, a plurality of data lines D1 to Dm, and a plurality of pixels PX. As shown in FIG. 2, the image display part 300 includes a liquid crystal display panel that includes a first substrate 100, a second substrate 200 facing the first substrate 100, and a liquid crystal layer 250 interposed between the first substrate 100 and the second substrate 200.

The gate lines G1 to Gn and the data lines D1 to Dm are disposed on the first substrate 100. The gate lines G1 to Gn are extended in a row direction and arranged in a column direction to be parallel to each other. The data lines D1 to Dm are extended in the column direction and arranged in the row direction to be parallel to each other.

According to an embodiment, each pixel PX is connected to an i-th (i is an integer equal to or greater than 1) gate line Gi and a j-th (j is an integer equal to or greater than 1) data line Dj and includes a thin film transistor Tr, a liquid crystal capacitor Clc, and a storage capacitor Cst.

The thin film transistor Tr includes a gate electrode connected to the i-th gate line Gi, a source electrode connected to the j-th data line Dj, and a drain electrode connected to the liquid crystal capacitor Clc and the storage capacitor Cst.

The liquid crystal capacitor Clc includes a pixel electrode PE and a common electrode CE, which are disposed on the first substrate 100, and the liquid crystal layer 250 functions as a dielectric substance of the liquid crystal capacitor Clc. The pixel electrode PE is electrically connected to the drain electrode of the thin film transistor Tr. The common electrode CE receives a reference voltage Vcom.

Each pixel PX includes color filters 230 that are disposed on the second substrate 200 and correspond to the pixel electrode PE, and each of the color filters 230 displays one of primary colors including, e.g., red, green, and blue. Alternatively, different from the structure shown in FIG. 2, the color filters 230 are formed on or under the pixel electrode PE of the first substrate 100.

Referring back to FIG. 1, the timing controller 600 receives a plurality of image signals RGB and a plurality of control signals CS from an outside source. The timing controller 600 converts a data format of the image signals RGB to a data format appropriate for an interface between the data driver 500 and the timing controller 600 and provides the converted image signals R'G'B' to the data driver 500. The timing controller 600 generates a data control signal D-CS, such as an output start signal or a horizontal start signal, and a gate control signal G-CS, such as a vertical start signal, a vertical clock signal, or a vertical clock bar signal, based on the control signals CS.

The data control signal D-CS is applied to the data driver 500, and the gate control signal G-CS is applied to the gate driver 400.

The gate driver 400 sequentially outputs gate signals in response to the gate control signal G-CS from the timing controller 600. Accordingly, the pixels PX are sequentially scanned by the gate signals on a per-row basis.

The data driver 500 converts the image signals R'G'B' to data voltages in response to the data control signal D-CS from the timing controller 600. The data voltages are applied to the image display part 300.

Thus, each pixel PX is turned on in response to a corresponding gate signal of the gate signals, and the turned-on pixel PX receives a corresponding data voltage from the data driver 500 to thereby display an image having a desired gray scale level.

Figure 3:
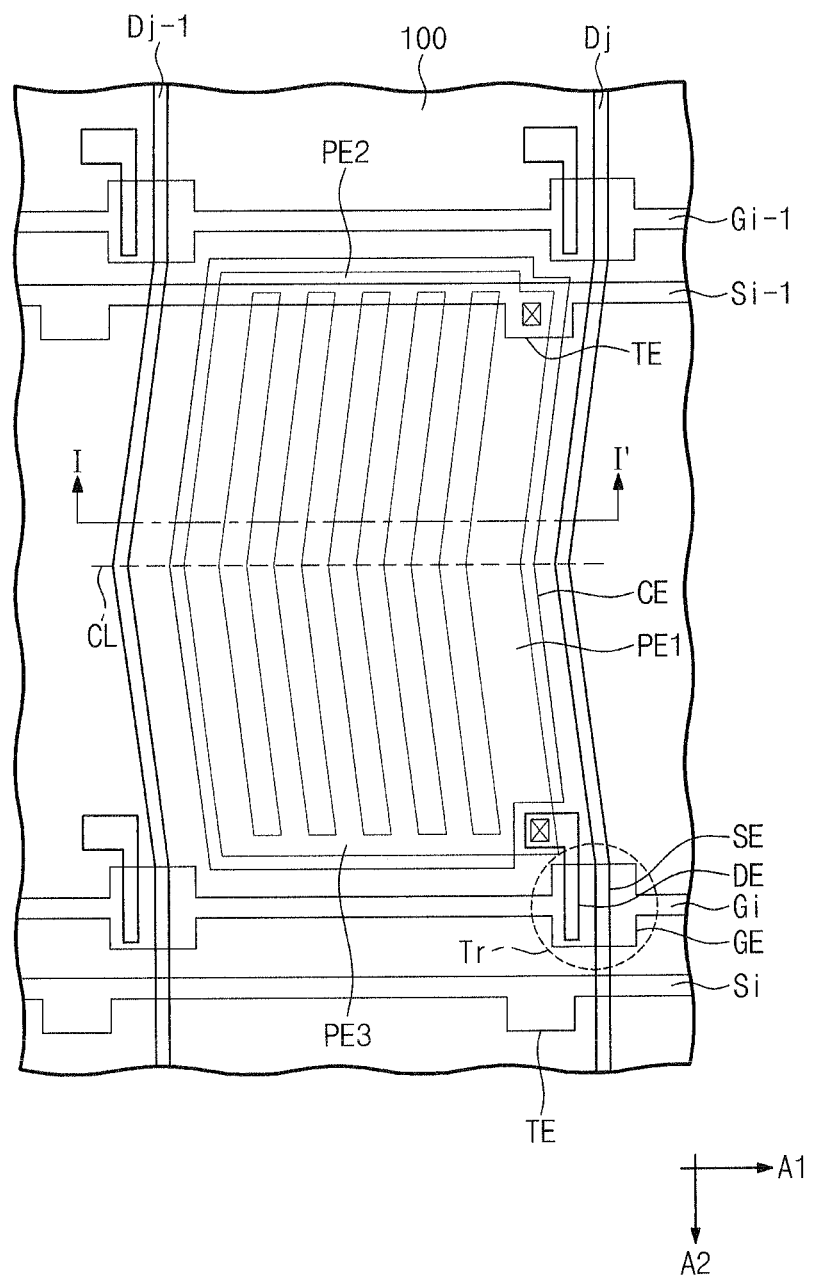
FIG. 3 is a plan view showing a liquid crystal display panel according to an exemplary embodiment of the invention.
Figure 4:
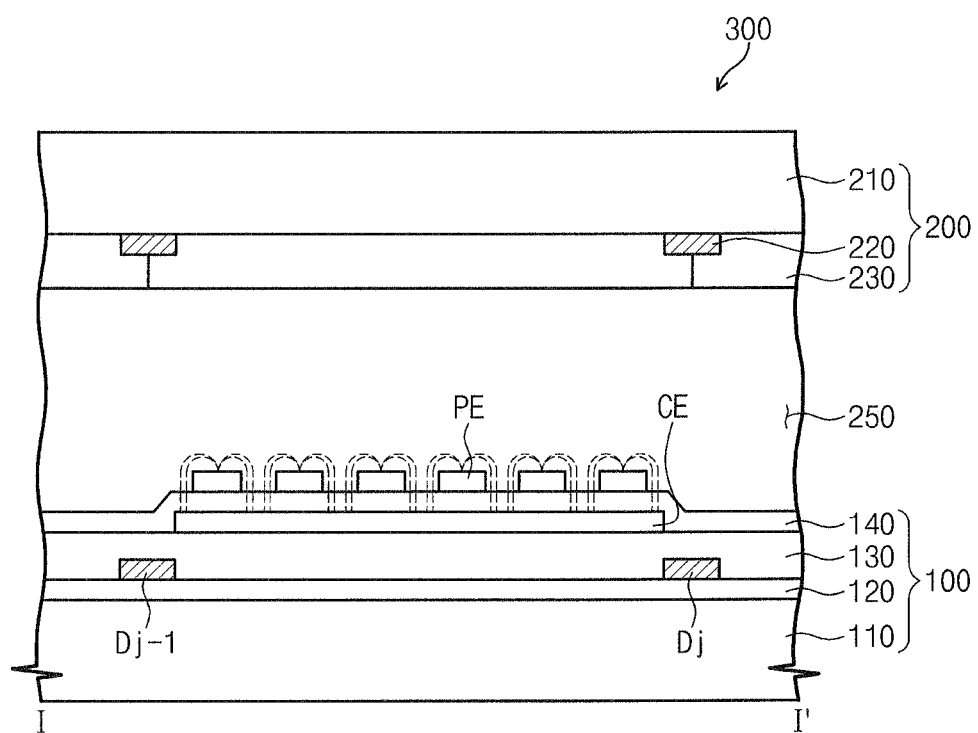
FIG. 4 is a cross-sectional view taken along a line I-I' shown in FIG. 3.

FIG. 3 is a plan view showing a liquid crystal display panel according to an exemplary embodiment of the invention, and FIG. 4 is a cross-sectional view taken along a line I-I' shown in FIG. 3.

Referring to FIG. 3 and FIG. 4, the liquid crystal display panel included in the image display part 300 includes the first substrate 100, the second substrate 200 facing the first substrate 100, and the liquid crystal layer 250 disposed between the first substrate 100 and the second substrate 200.

The first substrate 100 includes a first insulating substrate 110 formed of transparent glass or plastic, a first gate line Gi-1, a second gate line Gi, a first data line Dj-1, and a second data line Dj, which are disposed on the first insulating substrate 110.

The first and second gate lines Gi-1 and Gi are extended in a first direction A1 and spaced apart from each other in a second direction A2 substantially perpendicular to the first direction A1. The first and second data lines Dj-1 and Dj are extended in the second direction A2 and spaced apart from each other in the first direction A1.

The first and second gate lines Gi-1 and Gi are electrically insulated from the first and second data lines Dj-1 and Dj by a gate insulating layer 120. The first and second data lines Dj-1 and Dj are covered by a first protective layer 130. As an example, according to an embodiment, the first protective layer 130 includes at least a silicon oxycarbide (hereinafter, referred to as SiOC) layer.

As shown in FIG. 3, each of the first and second data lines Dj-1 and Dj is bent at its center portion to have a symmetrical shape with reference to a center line CL crossing a center portion between the first and second gate lines Gi-1 and Gi. A direction, in which each of the first and second data lines Dj-1 and Dj is bent, varies from row to row. For example, when the first and second data lines Dj-1 and Dj are bent leftward in a first row of pixels, the first and second data lines Dj-1 and Dj are bent rightward in a second row of pixels subsequent to the first row of pixels.

The first substrate 100 further includes a first storage line Si-1 disposed on the first insulating substrate 110 substantially in parallel to the first gate line Gi-1 and a second storage line Si disposed on the first insulating substrate 110 substantially in parallel to the second gate line Gi.

The thin film transistor Tr, the pixel electrode PE, and the common electrode CE are further disposed on the first insulating substrate 110. Specifically, the thin film transistor Tr includes a gate electrode GE branched from the second gate line Gi, a source electrode SE corresponding to a portion of the second data line Dj, and a drain electrode DE spaced apart from the source electrode SE above the gate electrode GE. The drain electrode DE is electrically connected to the pixel electrode PE.

As an example, according to an embodiment, the pixel electrode PE includes a plurality of branch electrodes PE1, a first connection portion PE2 connecting first ends of the branch electrodes PE1 to each other, and a second connection portion PE3 connecting second ends of the branch electrodes PE1 to each other. The branch electrodes PE1 are extended substantially in the second direction A2 in a space between the first and second data lines Dj-1 and Dj and arranged in the first direction A1. The branch electrodes PE1 are bent to be symmetrical about the center line CL.

The branch electrodes PE1 are inclined at an angle with respect to the center line CL, which is the same or substantially the same as an angle at which the first and second data lines Dj-1 and Dj are inclined with respect to the center line CL.

The common electrode CE is disposed on or under the pixel electrode PE and has a size corresponding to a pixel area defined by the first and second gate lines Gi-1 and Gi and the first and second data lines Dj-1 and Dj. As shown in FIG. 4, the common electrode CE is disposed under the pixel electrode PE. However, the position of the common electrode CE should not be limited to the lower portion of the pixel electrode PE. Alternatively, the common electrode CE is disposed on the pixel electrode PE. The common electrode CE faces the pixel electrode PE, with a second protective layer 140 interposed between the common electrode CE and the pixel electrode PE.

As an example, according to an embodiment, a storage electrode TE extended from the first storage line Si-1 is electrically connected to the common electrode CE. Thus, the common electrode CE receives a storage voltage applied to the first storage line Si-1 as a reference voltage Vcom.

The second substrate 200 includes a second insulating substrate 210 formed of transparent glass or plastic, the color filters 230 disposed on the second insulating substrate 230, and a black matrix 220 disposed between the color filters 230. The second substrate 200 is coupled to the first substrate 100 and faces the first substrate 100. The liquid crystal layer 250 is interposed between the first and second substrates 100 and 200.

When a gate signal is applied to the pixel PX through the second gate line Gi, the thin film transistor Tr is turned on in response to the gate signal. A data voltage passes through the second data line Dj and is applied to the pixel electrode PE through the drain electrode DE of the turned-on thin film transistor Tr.

The pixel electrode PE applied with the data voltage forms an electric field in cooperation with the common electrode CE applied with the reference voltage Vcom, so that the direction of the liquid crystal molecules of the liquid crystal layer 250, which are disposed on the pixel electrode PE and the common electrode CE, is controlled. Light passing through the liquid crystal layer 250 is polarized in various ways according to the direction of the liquid crystal molecules.

Since the pixel electrode PE and the common electrode CE form the liquid crystal capacitor Clc that employs the liquid crystal layer 250 as the dielectric substance of the liquid crystal capacitor Clc as shown in FIG. 1, the voltage applied to the pixel electrode PE may be maintained after the thin film transistor Tr is turned off. The first storage line Si-1 is formed to overlap the pixel electrode PE and the common electrode CE. Accordingly, the first storage line Si-1 together with the pixel electrode PE and the common electrode CE forms the storage capacitor Cst that uses the gate insulating layer 120 and the first and second protective layers 130 and 140 as the dielectric substance of the storage capacitor Cst as shown in FIG. 1, thereby increasing voltage maintaining ability of the liquid crystal capacitor Clc.

FIG. 5A to FIG. 5D are plan views showing a manufacturing process of a first substrate, and FIG. 6A to FIG. 6K are cross-sectional views showing a manufacturing process of the first substrate.

Figure 5A:
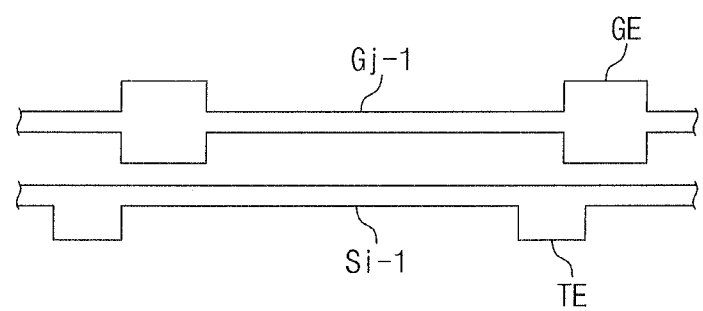
FIG. 5A to FIG. 5D are plan views showing a process of manufacturing a first substrate.
Figure 5A:
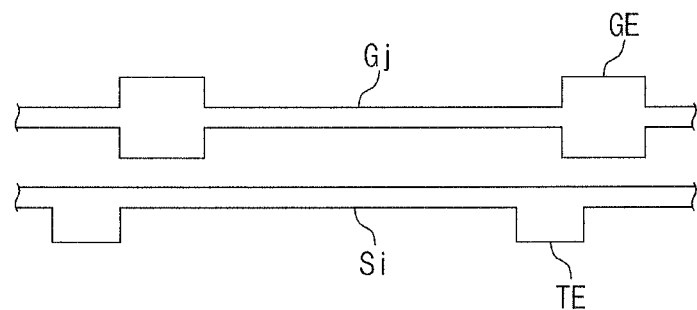
Figure 6A:
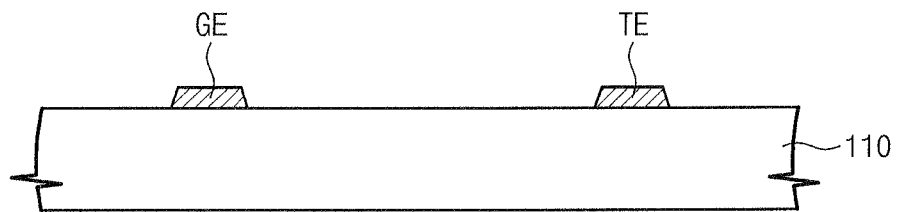
FIG. 6A to FIG. 6K are cross-sectional views showing a process of manufacturing a first substrate.

Referring to FIG. 5A and FIG. 6A, a first metal layer is formed on the first insulating substrate 110 and patterned to thereby form the first and second gate lines Gi-1 and Gi and the first and second storage lines Si-1 and Si. According to an embodiment, the first metal layer includes an aluminum-based metal, such as aluminum (Al) or aluminum alloys, a silver-based metal, such as silver (Ag) or silver alloys, a copper-based metal, such as copper (Cu) or copper alloys, a molybdenum-based metal, such as molybdenum (Mo) or molybdenum alloys, chromium (Cr), tantalum (Ta), or titanium (Ti). According to an embodiment, the first metal layer has a multi-layered structure of two or more conductive layers having different properties from each other.

A portion of each of the first and second gate lines Gi-1 and Gi is extended and forms the gate electrode GE, and a portion of each of the first and second storage lines Si-1 and Si is extended and forms the storage electrode TE.

Figure 6B:
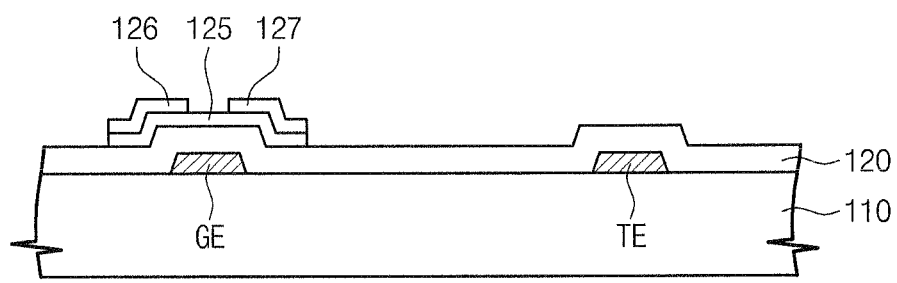

As shown in FIG. 6B, the first and second gate lines Gi-1 and Gi and the first and second storage lines Si-1 and Si are covered by the gate insulating layer 120. According to an embodiment, the gate insulating layer 120 is formed of silicon nitride (SiNx) or silicon oxide (SiOx).

A semiconductor layer 125 is formed of hydrogenated amorphous silicon or polysilicon on the gate insulating layer 120. The semiconductor layer 125 is disposed above the gate electrode GE.

First and second ohmic contact layers 126 and 127 are formed on the semiconductor layer 125. The first and second ohmic contact layers 126 and 127 are formed of n+ hydrogenated amorphous silicon doped with a high-concentration of n-type impurity, e.g., phosphor, or silicide. The first and second ohmic contact layers 126 and 127 are disposed on the semiconductor layer 125 and spaced apart from each other.

Figure 5B:
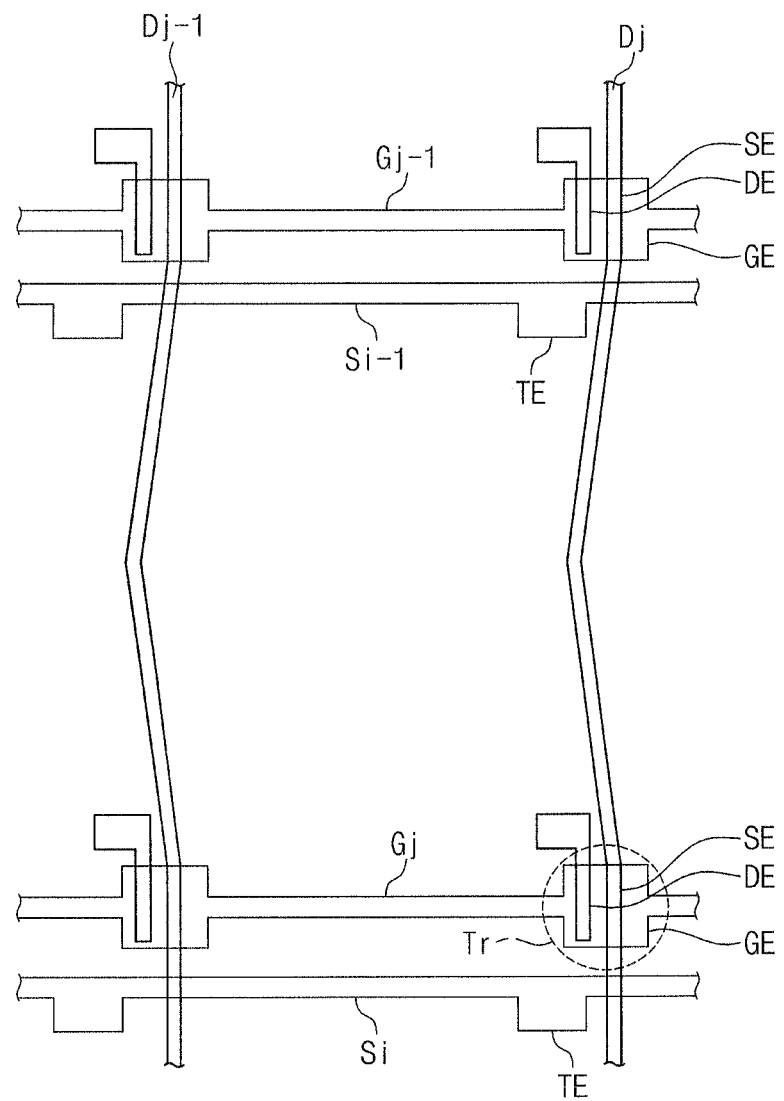
Figure 6C:
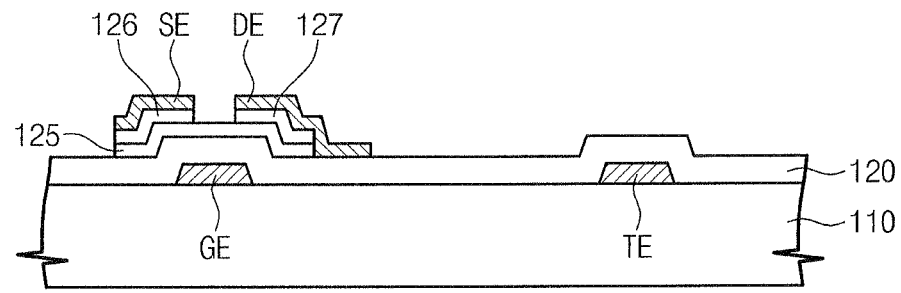

Referring to FIG. 5B and FIG. 6C, a second metal layer is formed on the gate insulating layer 120 and the first and second ohmic contact layers 126 and 127 and patterned to thereby form the first and second data lines Dj-1 and Dj. The second metal layer includes a refractory metal, such as molybdenum, chromium, tantalum, titanium, or an alloy thereof.

A portion of the first and second data lines Dj-1 and Dj, which faces the gate electrode GE, is defined as the source electrode SE and contacts the first ohmic contact layer 126. The drain electrode DE is disposed above the gate electrode GE to be spaced apart from the source electrode SE and contacts the second ohmic contact layer 127.

Figure 6D:
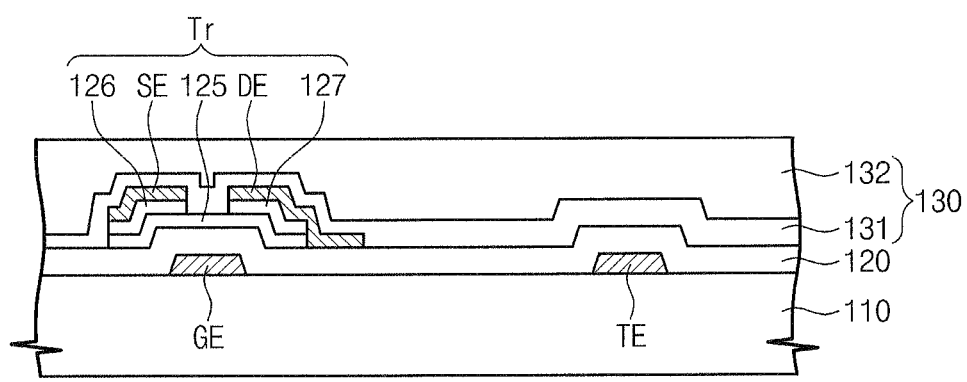

As shown in FIG. 6D, the first and second data lines Dj-1 and Dj and source and drain electrodes SE and DE are covered by the first protective layer 130. The first protective layer 130 includes a buffer layer 131 and an SiOC layer 132 that are sequentially stacked. According to an embodiment, the buffer layer 131 is formed of an inorganic insulating material, such as silicon nitride SiNx or silicon oxide SiOx. The SiOC layer 132 is disposed on the buffer layer 131.

The buffer layer 131 and the SiOC layer 132 are deposited by a chemical vapor deposition process. The SiOC layer 132 may withstand a temperature of about 370 degrees Celsius during the chemical vapor deposition process. For example, the SiOC layer 132 has a processing temperature higher than a processing temperature of the organic insulating material. The organic insulating material has a processing temperature of about 220 degrees Celsius or less. As an example, according to an embodiment, the chemical vapor deposition process for forming the SiOC layer 132 is performed in a temperature range from about 270 degrees Celsius to about 370 degrees Celsius.

The SiOC layer 132 has a superior heat-resistance when compared with the organic layer, and thus deterioration of display quality, which is caused by afterimages, may be prevented.

The SiOC layer 132 has a faster deposition speed than a deposition speed of the inorganic insulating material. The deposition speed of the inorganic insulating material is about 1000 angstroms per minute. For example, when the buffer layer 131 is formed of silicon nitride, the deposition of the buffer layer 131 is performed at a rate of about 2000 angstroms to about 5000 angstroms in about two or about three minutes in the chemical vapor deposition process. The deposition of the SiOC layer 132 is conducted at about two or about three micrometers in about two or about three minutes in the chemical vapor process. Accordingly, in the process of forming the first protective layer 130 having a thickness of about two or about three micrometers, it results in faster processing time to form the first protective layer 130 using the SiOC layer 132 rather than using silicon nitride or silicon oxide.

Further, the SiOC layer 132 is formed under a stress of about 15 Mpa, which is relatively lower than a stress under which an organic insulating layer is formed. Accordingly, the deposited SiOC layer 132 may be prevented from peeling off other layers, and an adhesive force between the SiOC layer 132 and the other layers may be prevented from being lowered. A thickness uniformity of the SiOC layer 132 formed by the deposition process is above about 6.2%, which is relatively higher than a thickness uniformity of the organic insulating layer, e.g., about 3%. A thickness uniformity is obtained by dividing a value, which is obtained by subtracting a minimum thickness of a layer to be deposited from a maximum thickness of the layer to be deposited, by a value which is obtained by adding the maximum thickness and the minimum thickness.

The SiOC layer 132 results in faster processing time, lower layer stress, and greater thickness uniformity than the organic insulating layer. The SiOC layer 132 is deposited to a thickness corresponding to the organic insulating layer during a processing time shorter than a processing time applied to the inorganic insulating material. The SiOC layer 132 has a dielectric constant from about 2.8 to about 3.0

The protective layer 130 includes the SiOC layer 132 and thus the same or substantially the same effect as is obtained when an organic layer is employed as the first protective layer 130 may be achieved. Since the SiOC layer 132 is under relatively a low stress and has a relatively high processing temperature and high thickness uniformity, a deterioration of display quality, which is caused by afterimages, may be prevented.

Figure 6E:
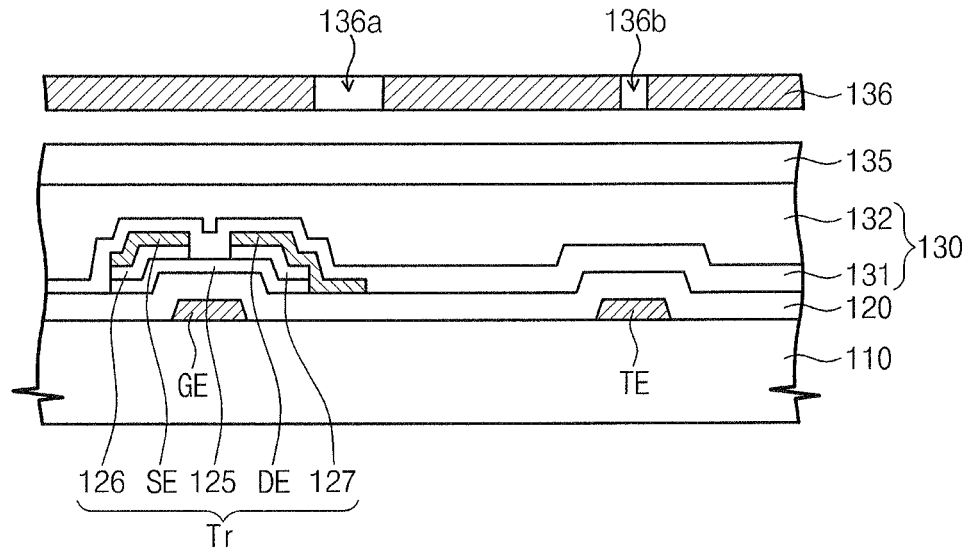

Referring to FIG. 6E, a photosensitive resin 135 is formed on the first protective layer 130. The photosensitive resin 135 is patterned by a photolithography process, and the first protective layer 130 is etched using the patterned photosensitive resin 135.

Figure 6F:
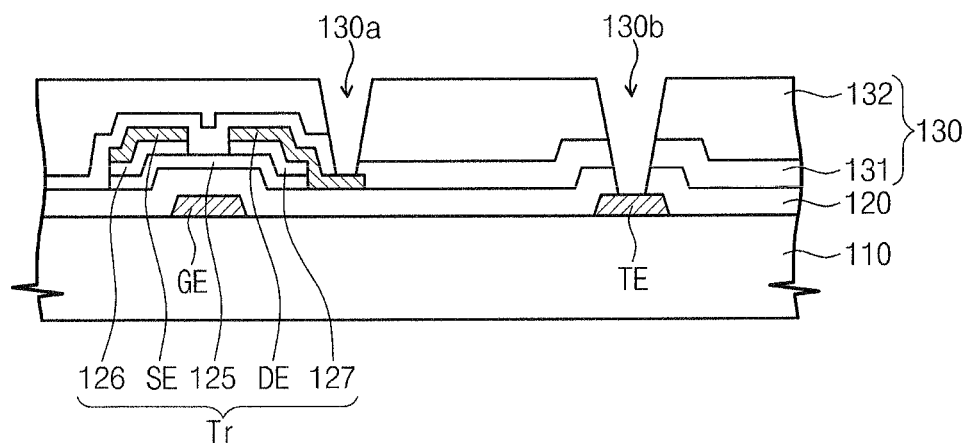

As an example, according to an embodiment, the photosensitive resin 135 includes a positive photosensitive resin. For example, a first exposure mask 136 is disposed on the photosensitive resin 135. The first exposure mask 136 includes first and second openings 136a and 136b that respectively correspond to portions of the first protective layer 130, which are to be removed. When the photosensitive resin 135 is exposed and developed after the first exposure mask 136 is disposed, a photosensitive resin pattern is formed and exposes the portions of the first protective layer 130. When the first protective layer 130 is etched using the photosensitive resin pattern as an etch mask, first and second contact holes 130a and 130b are formed through the first protective layer 130 as shown in FIG. 6F.

More specifically, the first contact hole 130a is formed by removing portions of the buffer layer 131 and the SiOC layer 132 to expose the drain electrode DE of the thin film transistor Tr. The second contact hole 130b is formed by removing portions of the gate insulating layer 120, the buffer layer 131, and the SiOC layer 132 to expose the storage electrode TE.

In FIG. 6E, the positive photosensitive resin 135 has been described as an example, but alternatively, the photosensitive resin 135 includes a negative photosensitive resin 135. When the SiOC layer 132 is patterned using the positive photosensitive resin, the first and second contact holes 130a and 130b may be reduced in diameter compared with when the SiOC layer 132 is patterned using the negative photosensitive resin. In other words, when the patterning of the SiOC layer 132 is performed using the positive photosensitive resin, the size of the first and second contact holes 130a and 130b may be controlled. When the size of the first and second contact holes 130a and 130b decreases, an aperture ratio of the pixel PX is increased, and thus a transmittance of the liquid crystal display 1000 may be increased.

Figure 5C:
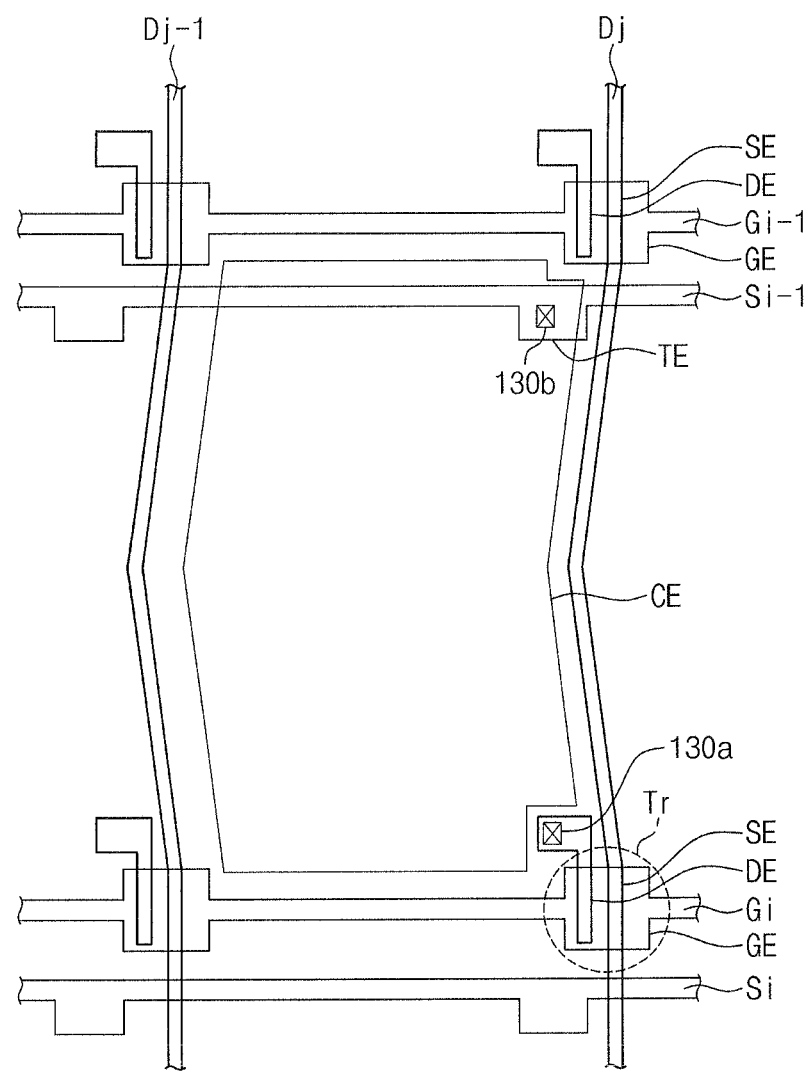
Figure 6G:
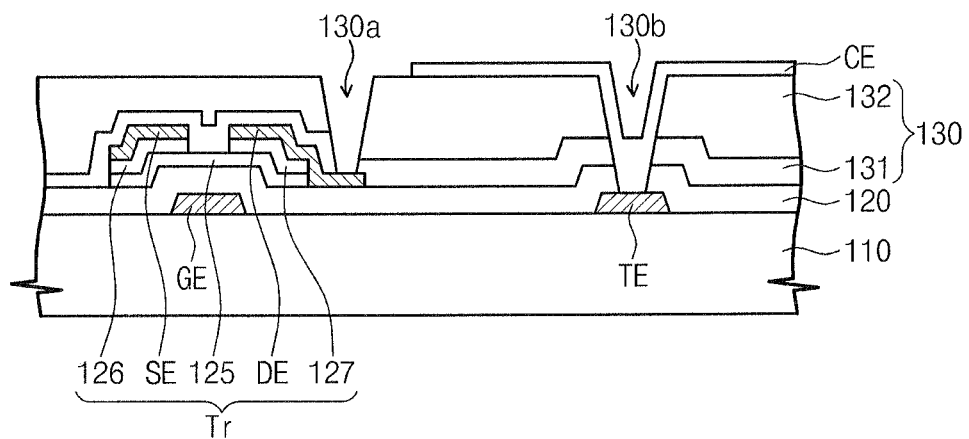

Referring to FIG. 5C and FIG. 6G, a first transparent conductive layer is formed on the first protective layer 130. The first transparent conductive layer is formed of a transparent conductive material, such as indium tin oxide. The first transparent conductive layer is patterned to thereby form the common electrode CE. The common electrode CE is electrically connected to the storage electrode TE through the second contact hole 130b. Accordingly, the common electrode CE receives a storage voltage as a reference voltage Vcom (as shown in FIG. 2) through the storage electrode TE.

Figure 6H:
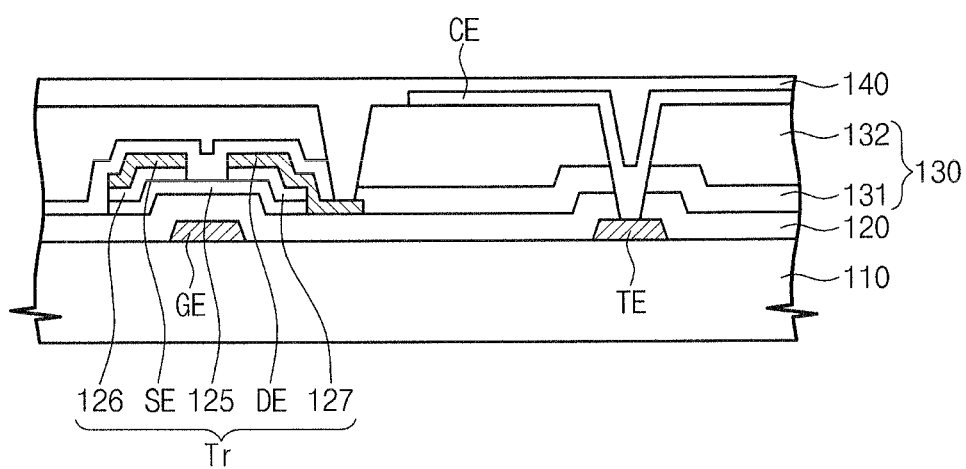

Referring to FIG. 6H, the common electrode CE is covered by the second protective layer 140. The second protective layer 140 is formed of an inorganic insulating material, such as silicon nitride or silicon oxide, or SiOC material.

Figure 6I:
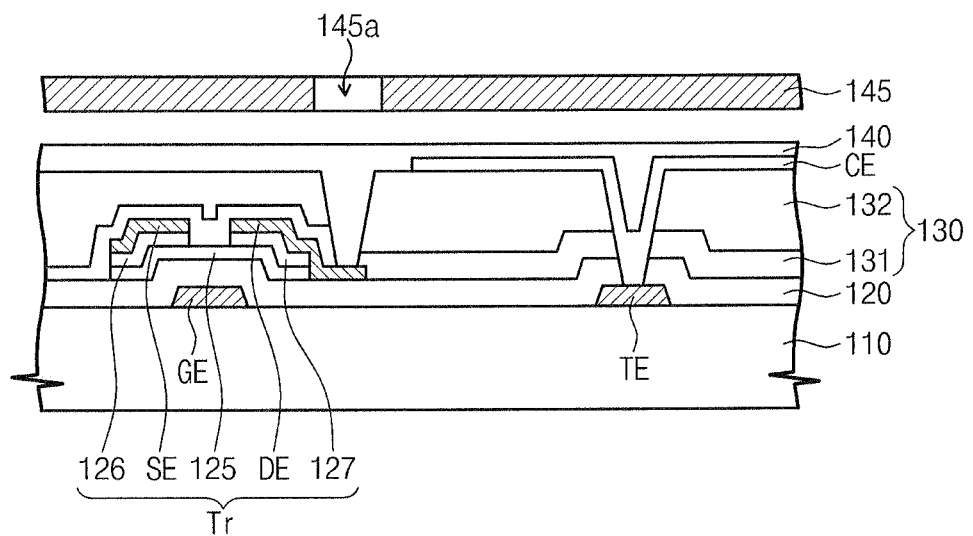

Referring to FIG. 6I, a photosensitive resin 143 is formed on the second protective layer 140. The photosensitive resin 143 is patterned by a photolithography process, and the second protective layer 140 is etched using the patterned photosensitive resin.

Figure 6J:
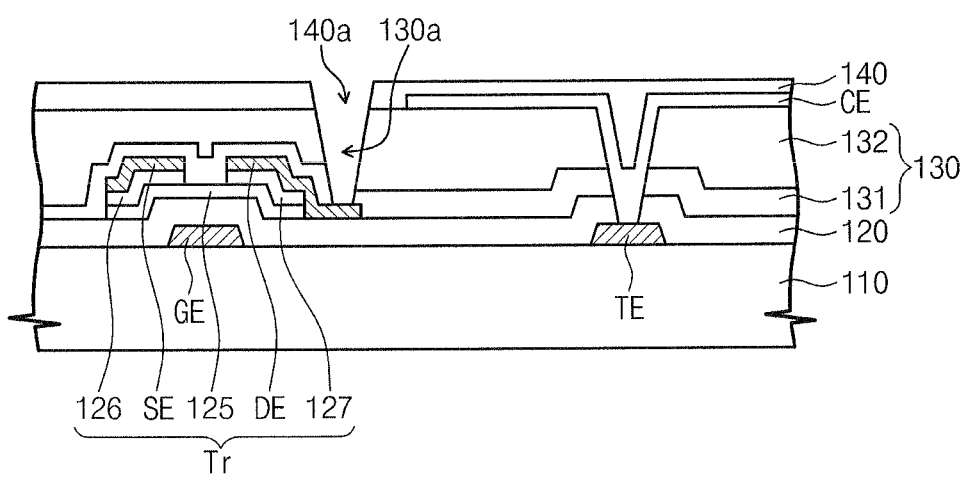

Specifically, a second exposure mask 145 is disposed on the photosensitive resin 143. The second exposure mask 145 includes a third opening 145a that corresponds to a portion of the second protective layer 140, which is to be removed. When the photosensitive resin 143 is exposed and developed after the second exposure mask 145 is disposed on the photosensitive resin 143, a photosensitive resin pattern is formed to thereby expose the portion of the second protective layer 140. When the second protective layer 140 is etched using the photosensitive resin pattern as an etch mask, a third contact holes 140a is formed through the second protective layer 140 as shown in FIG. 6J.

Specifically, the third contact hole 140a is formed by removing a portion of the second protective layer 140 and corresponds to the first contact hole 130a that exposes the drain electrode DE of the thin film transistor Tr.

Figure 5D:
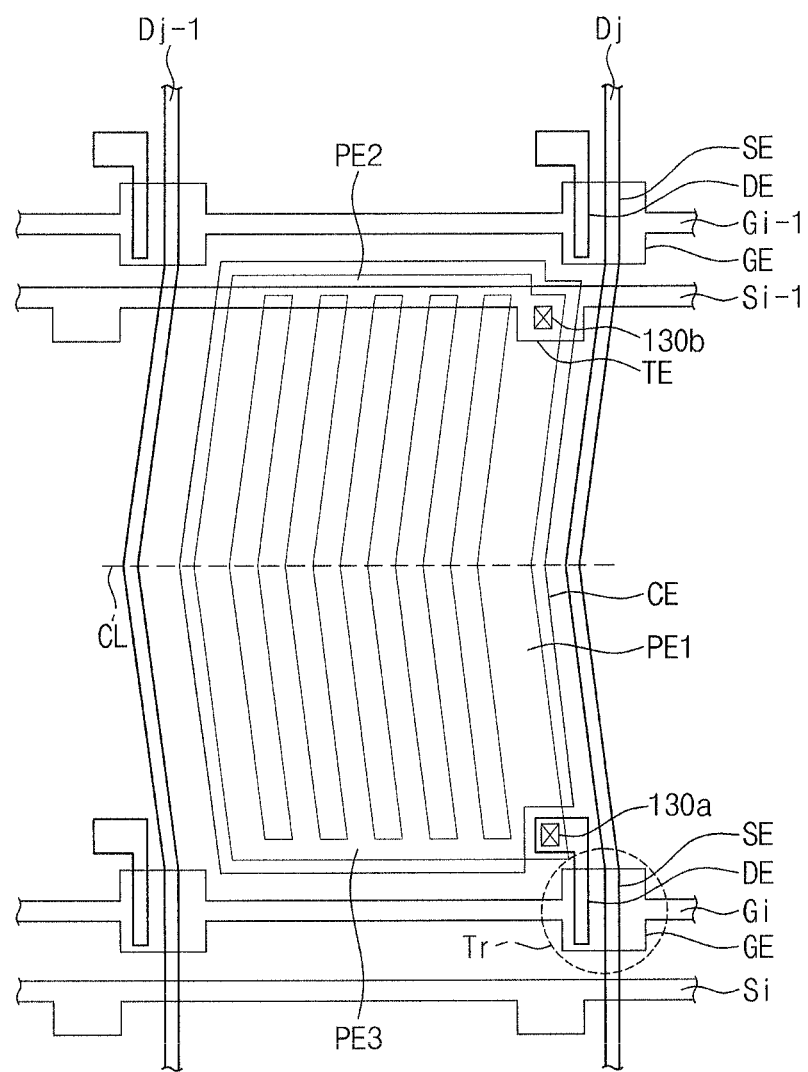
Figure 6K:
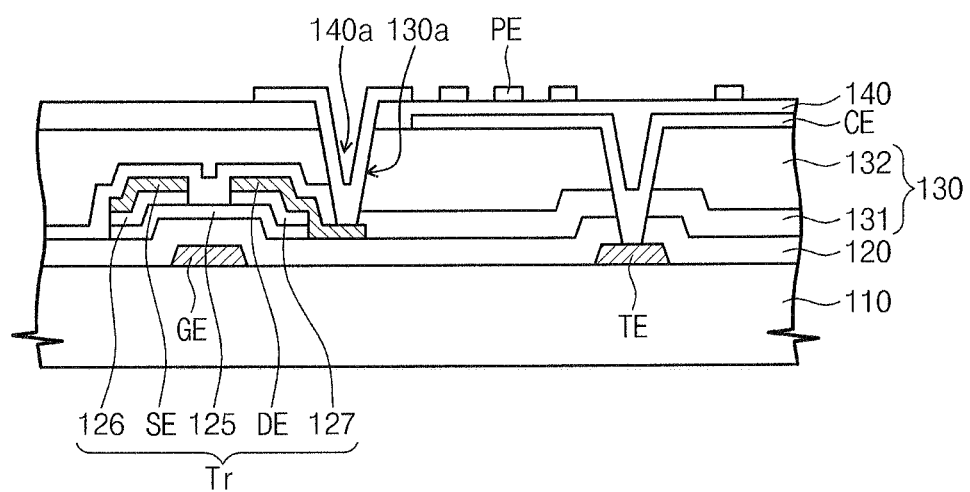

Referring to FIG. 5D and FIG. 6K, a second transparent conductive layer is formed on the second protective layer 140. The second transparent conductive layer is formed of a transparent conductive material, such as indium tin oxide. The second transparent conductive layer is patterned to thereby form the pixel electrode PE. The pixel electrode PE is electrically connected to the drain electrode DE through the first and third contact holes 130a and 140a. Accordingly, the pixel electrode PE receives a data voltage through the drain electrode DE.

As shown in FIG. 6K, the pixel electrode PE includes the branch electrodes PE1, the first connection portion PE2 connecting the first end portions of the branch electrodes PE1 to each other, and the second connection portion PE3 connecting the second end portions of the branch electrodes PE1 to each other.

Figure 7:
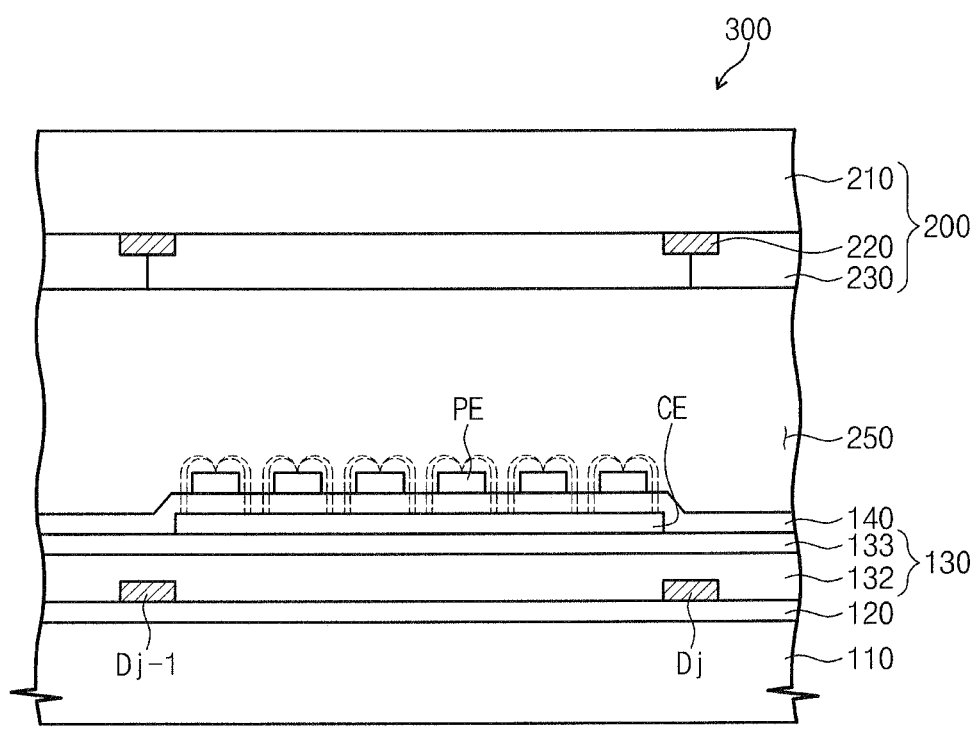
FIG. 7 is a cross-sectional view showing a liquid crystal display panel according to an exemplary embodiment of the invention.

FIG. 7 is a cross-sectional view showing a liquid crystal display panel according to an exemplary embodiment of the invention. The liquid crystal display panel shown in FIG. 7 has the same or substantially the same structure and function as those of the liquid crystal display panel described in connection with FIG. 4 except for the structure of the first protective layer.

Referring to FIG. 7, a liquid crystal display panel 300 includes a first protective layer 130 that is disposed on the gate insulating layer 120 and covers the first and second data lines Dj-1 and Dj and the source and drain electrodes SE and DE.

The first protective layer 130 includes a SiOC layer 132 and a capping layer 133 that are sequentially stacked. The SiOC layer 132 has a thickness of about two or about three micrometers, and the capping layer 133 is disposed on the SiOC layer 132. The capping layer 133 has a thickness smaller than a thickness of the SiOC layer 132. As an example, according to an embodiment, the capping layer 133 includes silicon nitride or silicon oxide.

The common electrode CE is disposed on the first protective layer 130. The first and second data lines Dj-1 and Dj are spaced apart from the common electrode CE by the SiOC layer 132 and the capping layer 133 of the first protective layer 130, so that the signal interference between the common electrode CE and the first and second data lines Dj-1 and Dj may be reduced.

Figure 8:
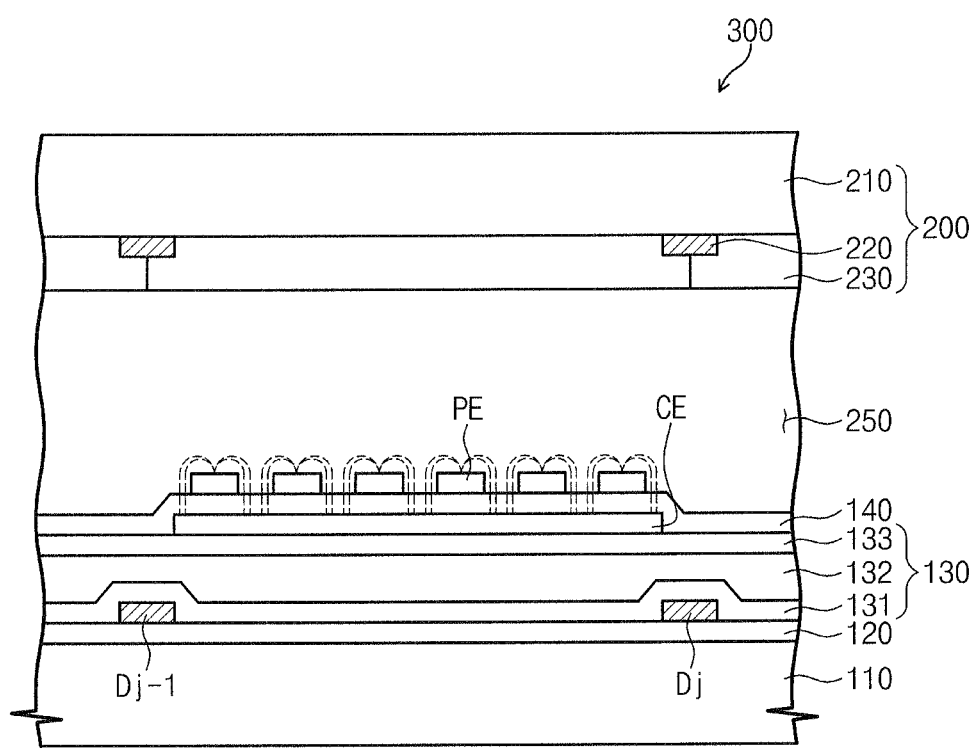
FIG. 8 is a cross-sectional view showing a liquid crystal display panel according to an exemplary embodiment of the invention.

FIG. 8 is a cross-sectional view showing a liquid crystal display panel according to an exemplary embodiment of the invention. The liquid crystal display panel shown in FIG. 8 has the same or substantially the same structure and function as those of the liquid crystal display panel described in connection with FIG. 4 except for the structure of the first protective layer.

Referring to FIG. 8, a liquid crystal display panel 300 includes a first protective layer 130 that is disposed on the gate insulating layer 120 and covers the first and second data lines Dj-1 and Dj and the source and drain electrodes SE and DE.

The first protective layer 130 includes a buffer layer 131, a SiOC layer 132, and a capping layer 133 that are sequentially stacked. The SiOC layer 132 has a thickness of about two or about three micrometers, and the buffer layer 131 and the capping layer 133 have a thickness smaller than a thickness of the SiOC layer 132. As an example, according to an embodiment, the buffer layer and the capping layer 133 include silicon nitride or silicon oxide.

The common electrode CE is disposed on the first protective layer 130. The first and second data lines Dj-1 and Dj are spaced apart from the common electrode CE by the buffer layer 131, the SiOC layer 132, and the capping layer 133 of the first protective layer 130, so that the signal interference between the common electrode CE and the first and second data lines Dj-1 and Dj may be reduced.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A liquid crystal display comprising:
a first substrate which includes a plurality of pixels;
a second substrate facing the first substrate; and
a liquid crystal layer between the first substrate and the second substrate, at least one of the pixels comprising:
a thin film transistor on a first insulating substrate;
a first protective layer which covers the thin film transistor and includes a silicon oxycarbide (SiOC) layer;
a first electrode on the first protective layer;
a second protective layer which covers the first electrode; and
a second electrode disposed on the second protective layer, wherein the first protective layer further comprises at least one of a capping layer that covers the SiOC layer and a buffer layer between the thin film transistor and the SiOC layer.

2. The liquid crystal display of claim 1, wherein the capping layer comprises silicon nitride or silicon oxide.

3. The liquid crystal display of claim 1, wherein the first protective layer comprises both of the capping layer and the buffer layer.

4. The liquid crystal display of claim 3, wherein the buffer layer and the capping layer comprise silicon nitride or silicon oxide.

5. The liquid crystal display of claim 1, wherein the SiOC layer has a thickness equal to or larger than about two micrometers.

6. The liquid crystal display of claim 1, wherein the SiOC layer has a dielectric constant from about 2.8 to about 3.0.

7. The liquid crystal display of claim 1, wherein the second protective layer comprises silicon nitride or silicon oxide.

8. The liquid crystal display of claim 1, wherein the first and second electrodes comprise a transparent conductive material.

9. The liquid crystal display of claim 1, wherein the first substrate comprises:
a plurality of gate lines on the first insulating substrate;
a plurality of data lines insulated from the gate lines, the data lines crossing the gate lines; and
a plurality of storage lines extended in parallel or substantially in parallel with the gate lines.

10. The liquid crystal display of claim 9, wherein the thin film transistor comprises a gate electrode extended from a corresponding gate line of the gate lines, a source electrode extended from a corresponding data line of the data lines, and a drain electrode electrically connected to the second electrode, and wherein at least one of the pixels further comprises a storage electrode extended from a corresponding storage line of the storage lines.

11. The liquid crystal display of claim 10, wherein the first electrode is electrically connected to the storage electrode, and the second electrode is electrically connected to the drain electrode of the thin film transistor.

12. A method of manufacturing a liquid crystal display comprising a first substrate including a plurality of pixels, a second substrate facing the first substrate, and a liquid crystal display between the first and second substrates, the method comprising:
forming a thin film transistor on a first insulating substrate;
forming a first protective layer including a SiOC layer that covers the thin film transistor;
forming a first electrode on the first protective layer;
forming a second protective layer that covers the first electrode; and
forming a second electrode on the second protective layer, wherein the first protective layer further includes at least one of a capping layer that covers the SiOC layer and a buffer layer between the thin film transistor and the SiOC layer.

13. The method of claim 12, wherein the first protective layer is formed by a chemical vapor deposition process at a temperature from about 270 degrees Celsius to about 370 degrees Celsius.

14. The method of claim 12, wherein the first substrate comprises:
- a plurality of gate lines on the first insulating substrate;
- a plurality of data lines insulated from the gate lines, the data lines crossing the gate lines; and
- a plurality of storage lines extended in parallel or substantially in parallel with the gate lines.

15. The method of claim 14, wherein the thin film transistor comprises a gate electrode extended from a corresponding gate line of the gate lines, a source electrode extended from a corresponding data line of the data lines, and a drain electrode electrically connected to the second electrode, and wherein at least one of the pixels further comprises a storage electrode extended from a corresponding storage line of the storage lines.

16. The method of claim 15, wherein forming the first substrate further comprises forming a first contact hole through the first protective layer to expose the drain electrode and a second contact hole through the first protective layer to expose the storage electrode.

17. The method of claim 16, wherein forming the first and second contact holes comprises:
- forming a photosensitive resin on the first protective layer;
- patterning the photosensitive resin;
- etching the first protective layer using the patterned photosensitive resin as a mask to form the first and second contact holes; and
- removing the photosensitive resin.

18. The method of claim 17, wherein the photosensitive resin includes a positive type photosensitive resin.

19. A display apparatus comprising:
- a plurality of data lines;
- an SiOC layer on the plurality of data lines;
- a common electrode on the SiOC layer;
- a protective layer on the common electrode;
- a pixel electrode on the protective layer; and
- a capping layer between the SiOC layer and the common electrode.

20. The display apparatus of claim 19, further comprising a buffer layer between the plurality of data lines and the SiOC layer.

21. The display apparatus of claim 19, wherein the SiOC layer has a thickness of about two micrometers to about three micrometers.

* * * * *